US010910021B2

(12) United States Patent
Ishikawa

(10) Patent No.: US 10,910,021 B2
(45) Date of Patent: Feb. 2, 2021

(54) SEMICONDUCTOR DEVICE AND SEMICONDUCTOR DEVICE CONTROL METHOD

(71) Applicant: RENESAS ELECTRONICS CORPORATION, Tokyo (JP)

(72) Inventor: Naoshi Ishikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 73 days.

(21) Appl. No.: 16/183,244

(22) Filed: Nov. 7, 2018

(65) Prior Publication Data
US 2019/0198062 A1 Jun. 27, 2019

(30) Foreign Application Priority Data
Dec. 22, 2017 (JP) ................. 2017-246335

(51) Int. Cl.
  *G11C 5/14* (2006.01)
  *G06F 1/30* (2006.01)
  *G01R 19/165* (2006.01)
(52) U.S. Cl.
  CPC ........ *G11C 5/147* (2013.01); *G01R 19/16552* (2013.01); *G06F 1/305* (2013.01)
(58) Field of Classification Search
  CPC .................................................. G11C 5/147
  USPC ....................................................... 365/227
  See application file for complete search history.

(56) References Cited

U.S. PATENT DOCUMENTS

| 6,097,638 A * | 8/2000 | Himeno ................. G11C 16/26 365/185.25 |
| 10,283,961 B2 * | 5/2019 | Shimakura .......... H02J 13/0006 |
| 2002/0097621 A1 * | 7/2002 | Fujiwara ........... H01L 27/11568 365/204 |
| 2002/0171407 A1 | 11/2002 | Blaauw et al. |
| 2005/0202293 A1 * | 9/2005 | Kagami ........... H01M 8/04029 429/414 |

FOREIGN PATENT DOCUMENTS

JP 2005-249526 A 9/2005

OTHER PUBLICATIONS

Extended European Search Report issued in corresponding European Patent Application No. 18203780.4-1221, dated May 9, 2019.

* cited by examiner

*Primary Examiner* — Muna A Techane
(74) *Attorney, Agent, or Firm* — McDermott Will & Emery LLP

(57) ABSTRACT

Disclosed is a semiconductor device in which an internal voltage fluctuation when a current jump occurs is restrained. The semiconductor device includes a plurality of blocks, each of which performs a given operation, and a current jump control circuit. The current jump control circuit monitors control signals in each of the blocks and calculates predicted values of consumption current of the blocks, based on results of monitoring at different timings, thereby controlling a fluctuation of consumption current of the blocks. The current jump control circuit controls operation of a subset or all of the blocks, if an increase of a predicted value of consumption current of the blocks is larger than a first value or a decrease of the predicted value is larger than a second value.

11 Claims, 8 Drawing Sheets

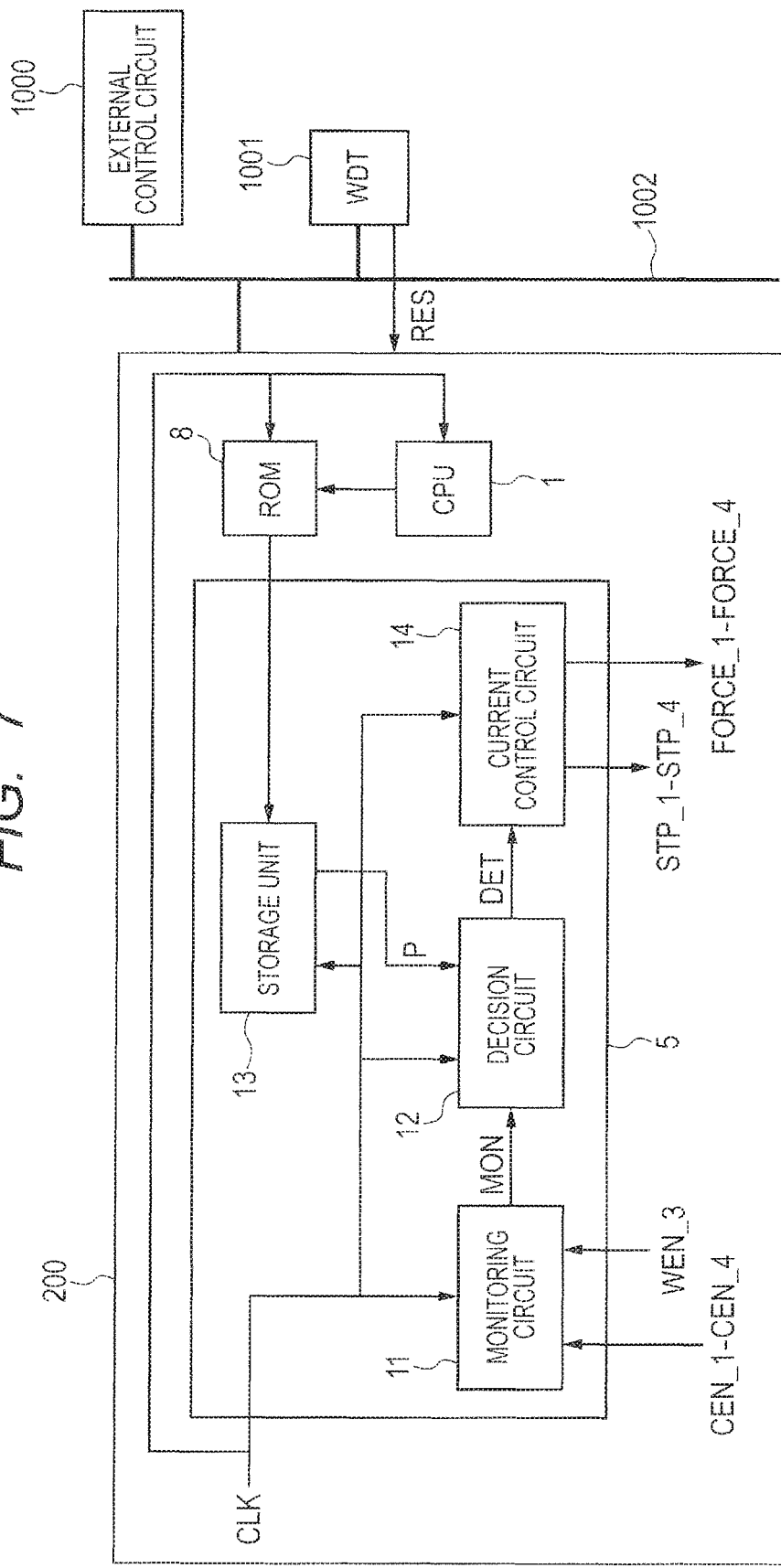

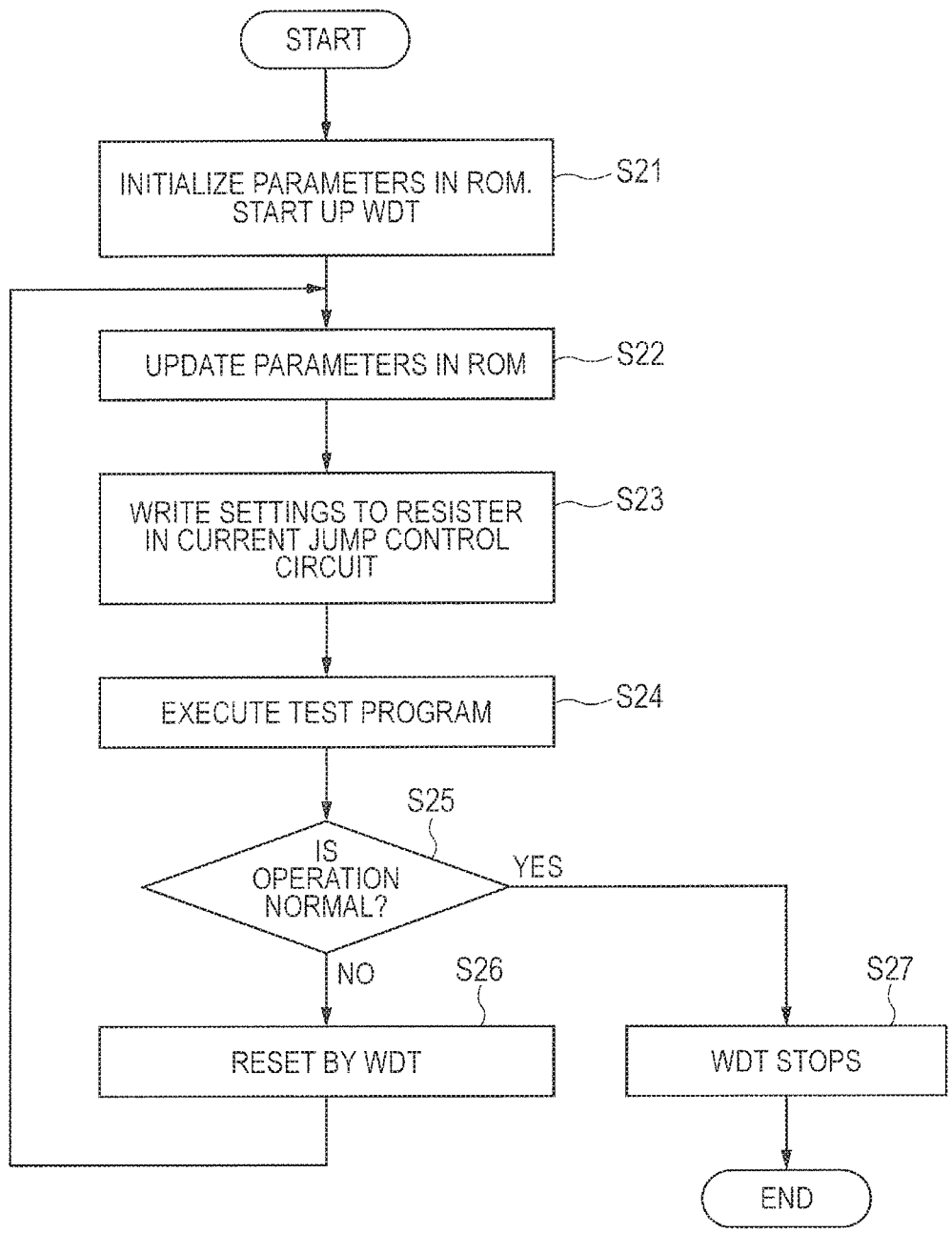

SEMICONDUCTOR DEVICE AND SEMICONDUCTOR DEVICE CONTROL METHOD

CROSS-REFERENCE TO RELATED APPLICATIONS

The disclosure of Japanese Patent Application No. 2017-246335 filed on Dec. 22, 2017 including the specification, drawings and abstract is incorporated herein by reference in its entirety.

BACKGROUND

The present invention relates to a semiconductor device and a semiconductor device control method.

Because of more microfabrication processes in manufacturing semiconductor devices, there have been a decrease in chip area and a reduction in parasitic capacitance. On the other hand, there is no reduction in consumption current, despite the decrease in area. Consequently, when an abrupt sharp increase or decrease of consumption current, namely, a so-called current jump occurs, an abrupt sharp rise or fall of an internal voltage occurs and a problem arises in which a voltage value deviates from a guaranteed voltage range.

And now, consumption current includes a dynamic consumption current that increases or decreases by more activation or deactivation of each part of a chip and a static current such as a leak current that less increases or decreases by chip operation. Herein, we focus on increase or decrease in the dynamic power consumption.

To cope with the above problem, proposed is a method for restraining the occurrence of a current jump by controlling switchover of a clock frequency (Patent Document 1). Generally, the increase or decrease of consumption current is liable to occur upon the switchover of a clock frequency. Therefore, this method prevents the abrupt sharp increase and decrease of voltage by changing a clock frequency rather slowly without switching over a clock frequency quickly.

RELATED ART DOCUMENT

Patent Document

[Patent Document 1]
Japanese Unexamined Patent Application Publication No. 2005-249526

SUMMARY

As described above, an abrupt sharp rise or fall of an internal voltage occurs, attributed to an abrupt sharp increase or decrease of consumption current. In fact, switchover of a clock signal is only one factor of causing an abrupt sharp rise or fall of an internal voltage. Hence, the method concerned with Patent Document 1 is essentially incapable of preventing a current jump due to a cause other than switchover of a clock signal.

Other problems and novel features will become apparent from the description in the present specification and the accompanying drawings.

A semiconductor device concerned with one embodiment includes a plurality of blocks, each of which performs a given operation, and a control circuit which monitors control signals in each of the blocks and calculates predicted values of consumption current of the blocks, based on results of monitoring at different timings, thereby controlling a fluctuation of consumption current of the blocks. The control circuit controls a subset or all of the blocks to decrease consumption current, if an increase of a predicted value of the consumption current is larger than a first value, and controls a subset or all of the blocks to increase consumption current, if a decrease of a predicted value of the consumption current is larger than a second value.

A semiconductor device control method concerned with one embodiment includes: monitoring control signals in each of a plurality of blocks, each of which performs a given operation; calculating predicted values of consumption current of the blocks, based on results of monitoring at different timings; controlling a subset or all of the blocks to decrease consumption current, if an increase of a predicted value of consumption current of the blocks is larger than a first value; and controlling a subset or all of the blocks to increase consumption current, if a decrease of a predicted value of consumption current of the blocks is larger than a second value.

According to one embodiment, it is possible to restrain an internal voltage fluctuation when a current jump occurs in a semiconductor device.

BRIEF DESCRIPTION OF THE DRAWINGS

FIG. 7 is a diagram schematically depicting a configuration of a principal part of a semiconductor device concerned with a second embodiment.

FIG. 8 is a flowchart illustrating a method for automatically updating parameters for use for control of a current jump in the semiconductor device concerned with the second embodiment.

DETAILED DESCRIPTION

In the following, embodiments of the present invention will be described with reference to the drawings. In the respective drawings, identical elements are assigned identical reference designators and their duplicative description is omitted, as appropriate.

First Embodiment

A semiconductor device 100 concerned with a first embodiment is described. The semiconductor device 100 is configured to enable preventing a total value of consumption currents of all blocks provided in the semiconductor device and controlling operation of the blocks according to a predicted value. And now, consumption current includes a dynamic consumption current that increases or decreases by more activation or deactivation of each part of a chip and a static current such as a leak current that less increases or decreases by chip operation. Herein, we focus on increase or decrease in the dynamic power consumption.

Figure 1:
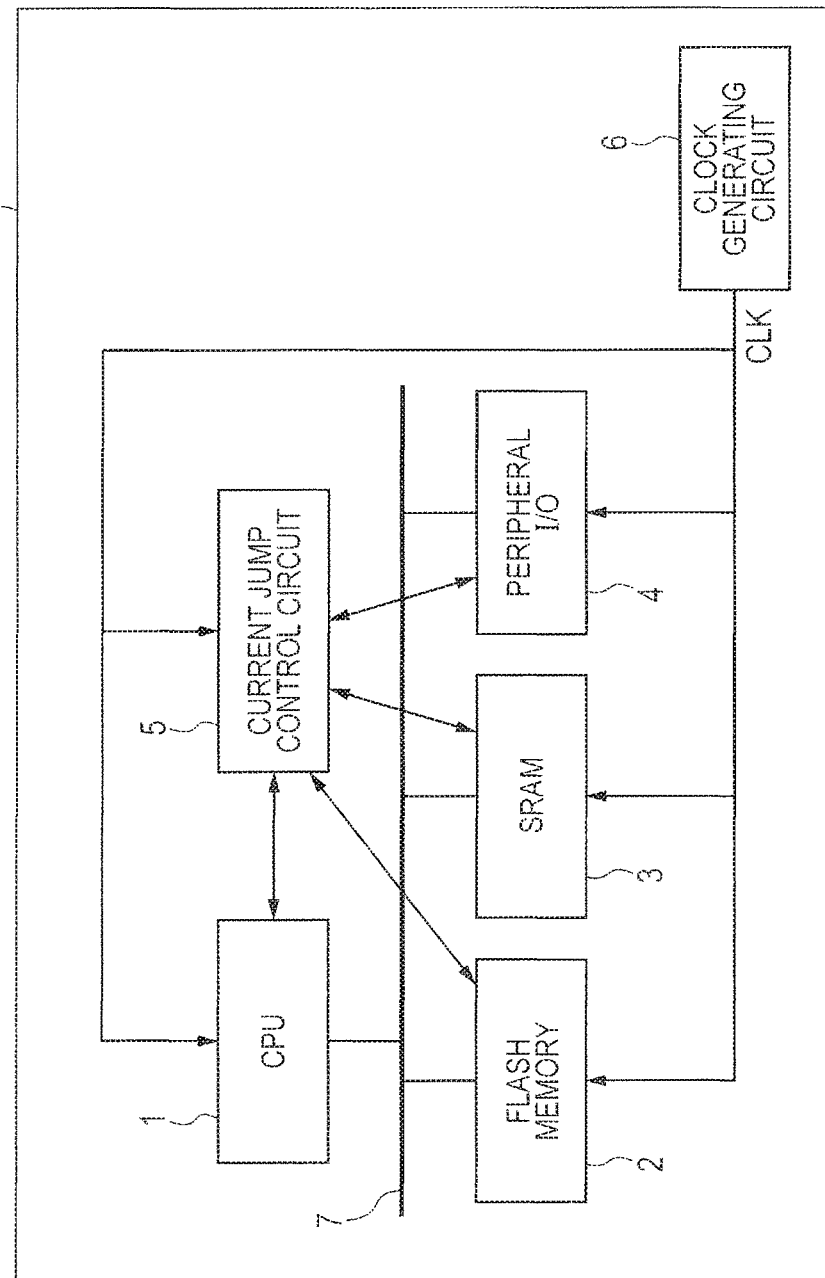
FIG. 1 is a diagram schematically depicting a configuration of a semiconductor device concerned with a first embodiment.

FIG. 1 schematically depicts the semiconductor device 100 concerned with the first embodiment. The semiconductor device 100 includes a CPU (Central Processing Unit) 1, a flash memory 2, an SRAM (Static Random Access Memory) 3, a peripheral I/O (Input/Output) 4, a current jump control circuit 5, and a clock generating circuit 6.

The CPU 1, flash memory 2, SRAM 3, and peripheral I/O 4 are configured to be able to send and receive data to/from one another via a bus 7.

The CPU 1 performs calculation based on a program and data read in from the flash memory 2 and SRAM 3 or a signal received from the peripheral I/O 4. Also, the CPU 1 can write a result of calculation to the flash memory 2 and SRAM 3 or output it to the peripheral I/O 4, as appropriate. Although the semiconductor device 100 is equipped with the flash memory 2 and SRAM 3 as a memory block; needless to say, the semiconductor device may be equipped with a memory block other than the flash memory 2 and SRAM 3.

The flash memory 2 and SRAM 3 are configured such that they can store a program and data for use in calculation by the CPU 1 and data received from the current jump control circuit 5.

The current jump control circuit 5 predicts current that will be consumed in each block provided in the semiconductor device 100 and controls operation of each block based on a result of the prediction. In the present embodiment, the current jump control circuit 5 is provided as a chip specialized for control of a current jump independently of the CPU 1. Therefore, the current jump control circuit 5 performs processing for current jump control, so that an increase in the load of the CPU 1 can be prevented and, besides, the processing for current jump control can be carried out at high speed by using the dedicated circuit.

Figure 2:
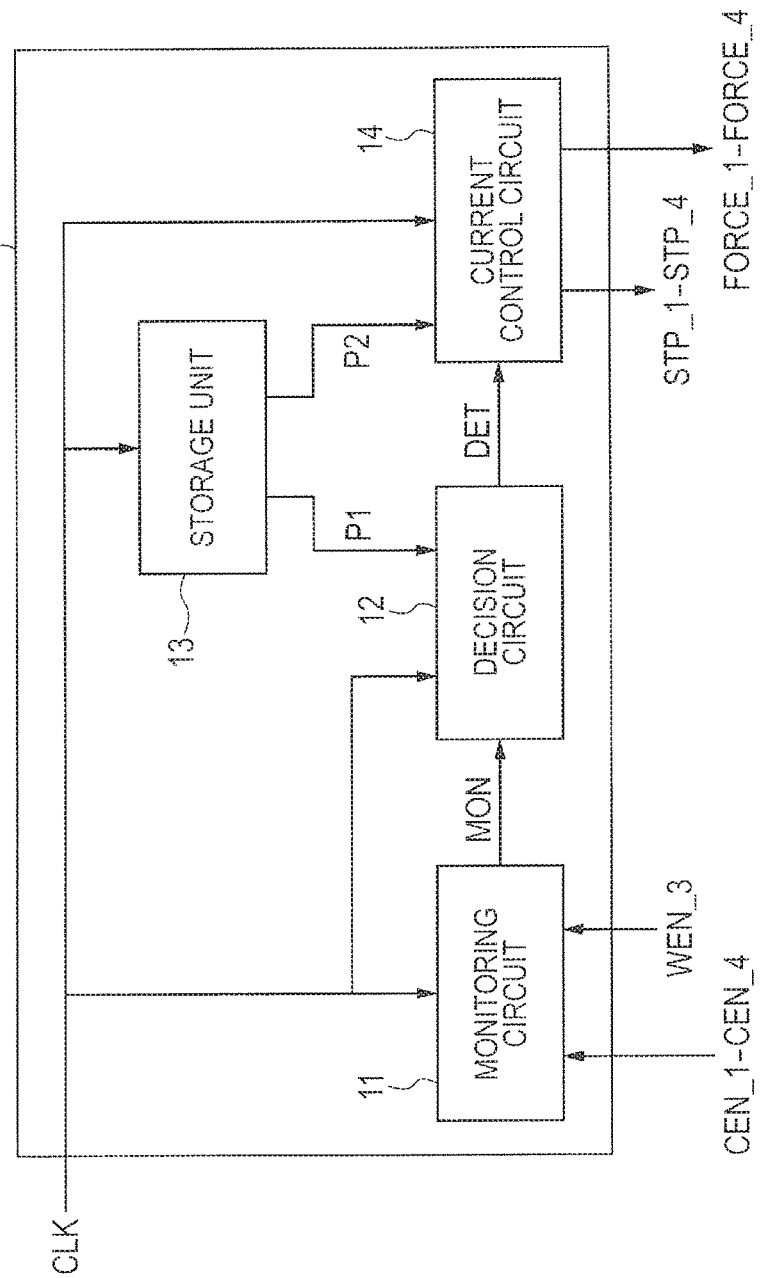
FIG. 2 is a diagram schematically depicting a configuration of a current jump control circuit.

Now, a description is provided on how the current jump control circuit 5 is configured. FIG. 2 schematically depicts a configuration of the current jump control circuit 5. The current jump control circuit 5 includes a monitoring circuit 11, a decision circuit 12, a storage unit 13, and a current control circuit 14.

The monitoring circuit 11 monitors control signals internal to the flash memory 2, SRAM 3, and peripheral I/O 4 and notifies the decision circuit 12 of a monitoring result MON.

The decision circuit 12 decides whether or not a current jump occurs according to the result of monitoring of control signals internal to each block and outputs a detection signal DET.

In the storage unit 13, parameters are stored: various parameters P1 that are used when the decision circuit 12 decides whether or not a current jump occurs and various parameters P2 that are used for the current control circuit 14 to control operation of each block.

The current control circuit 14 controls operation of each block, based on the detection signal DET of a current jump occurring, when decided by the decision circuit 12.

The clock generating circuit 6 supplies a clock signal CLK to the blocks within the semiconductor device 100: i.e., the CPU 1, flash memory 2, SRAM 3, peripheral I/O 4, and current jump control circuit 5.

Figure 3:
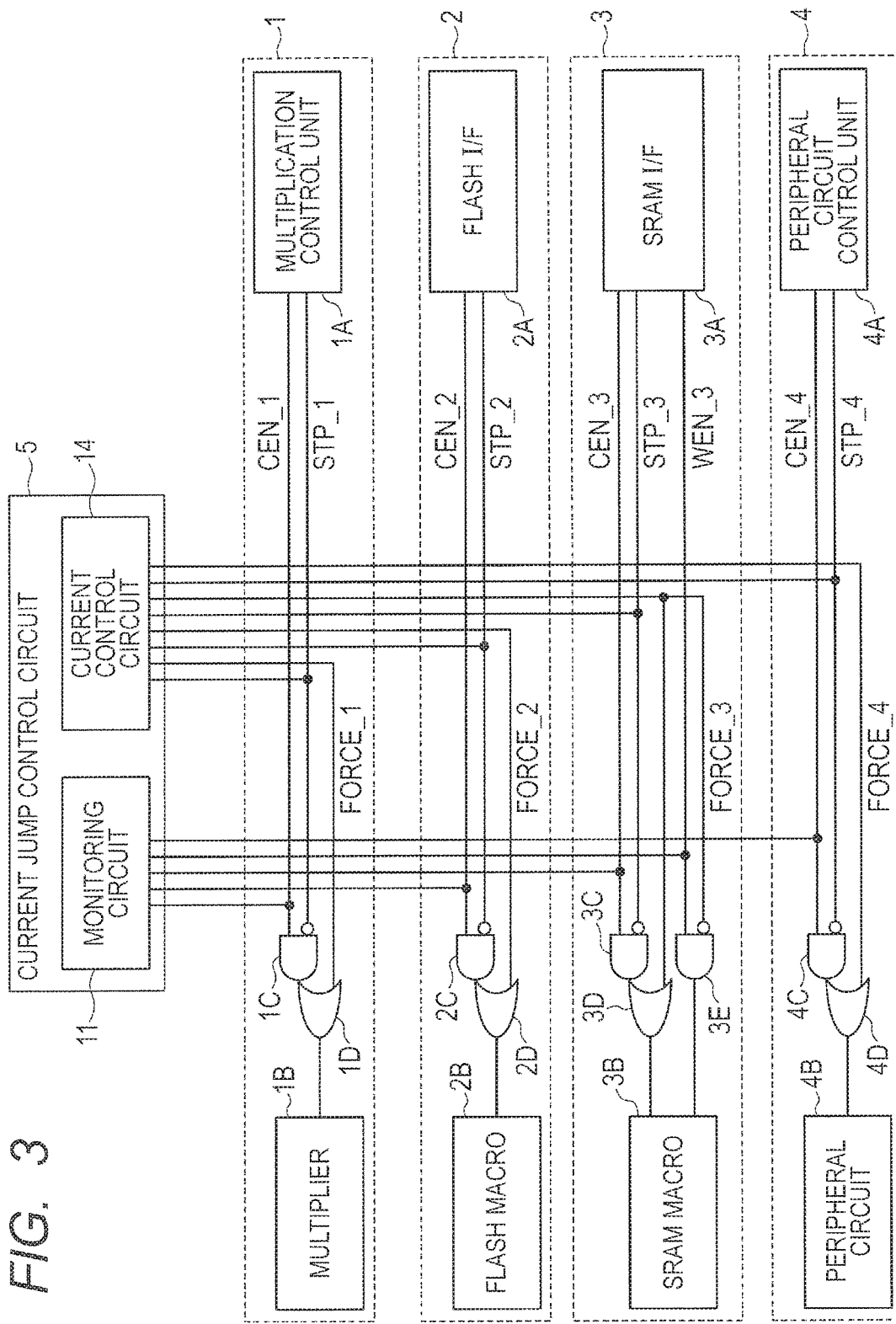
FIG. 3 is a diagram depicting coupling relations between the current jump control circuit and each block.

Then, a description is provided on coupling relations between the current jump control circuit 5 and each block. FIG. 3 depicts coupling relations between the current jump control circuit 5 and each block.

The CPU 1 includes a multiplication control unit 1A, a multiplier 1B, an AND circuit 1C, and an OR circuit 1D. The multiplication control unit 1A and the current control circuit 14 are coupled to one input of the AND circuit 1C in an inverse logic manner so as to be able to output a stop signal STP_1 to the AND circuit 1C. The multiplication control unit 1A and the monitoring circuit 11 are coupled to the other input of the AND circuit 1C so that the multiplication control unit 1A is able to output a clock enable signal CEN_1 to the AND circuit 1C and the monitoring circuit 11 is able to monitor the clock enable signal CEN_1. Output of the AND circuit 1C is coupled to one input of the OR circuit 1D. The current control circuit 14 is coupled to the other input of the OR circuit 1D so as to be able to output a forced more activation signal FORCE_1 to the OR circuit 1D. Output of the OR circuit 1D is coupled to the multiplier 1B.

For example, by supplying the CPU 1 with "0" as the stop signal STP_1 and "1" as the clock enable signal CEN_1, the CPU 1 will be more activated. On the other hand, by supplying the CPU 1 with "1" as the stop signal STP_1, the CPU 1 can be deactivated forcedly. Besides, by supplying the CPU 1 with "1" as the forced more activation signal FORCE_1, the CPU 1 can be more activated forcedly. In this case, for example, a program that predefines calculations or the like to be executed when the CPU 1 is more activated forcedly may be preconfigured and the CPU 1 may execute the program when it is more activated forcedly.

The flash memory 2 includes a flash interface (I/F) 2A, a flash macro 2B, an AND circuit 2C, and an OR circuit 2D. The flash I/F 2A and the current control circuit 14 are coupled to one input of the AND circuit 2C in an inverse logic manner so as to be able to output a stop signal STP_2 to the AND circuit 2C. The flash I/F 2A and the monitoring circuit 11 are coupled to the other input of the AND circuit 2C so that the flash I/F 2A is able to output a clock enable signal CEN_2 to the AND circuit 2C and the monitoring circuit 11 is able to monitor the clock enable signal CEN_2. Output of the AND circuit 2C is coupled to one input of the OR circuit 2D. The current control circuit 14 is coupled to the other input of the OR circuit 2D so as to be able to output a forced more activation signal FORCE_2 to the OR circuit 2D. Output of the OR circuit 2D is coupled to the flash macro 2B.

For example, by supplying the flash memory 2 with "0" as the stop signal STP_2 and "1" as the clock enable signal CEN_2, the flash memory 2 will be more activated. On the other hand, by supplying the flash memory 2 with "1" as the stop signal STP_2, the flash memory 2 can be deactivated forcedly. Besides, by supplying the flash memory 2 with "1" as the forced more activation signal FORCE_2, the flash memory 2 can be more activated forcedly. In this case, forcedly more activating the flash memory may be implemented by, for example, idly reading the flash memory when it is more activated forcedly.

The SRAM 3 includes an SRAM interface (I/F) 3A, an SRAM macro 3B, an AND circuit 3C, an OR circuit 3D, and an AND circuit 3E. The SRAM I/F 3A and the current control circuit 14 are coupled to one input of the AND circuit 3C in an inverse logic manner so as to be able to output a stop signal STP_3 to the AND circuit 3C. The SRAM I/F 3A and the monitoring circuit 11 are coupled to the other input of the AND circuit 3C so that the SRAM I/F 3A is able to output a clock enable signal CEN_3 to the AND circuit 3C and the monitoring circuit 11 is able to monitor the clock enable signal CEN_3. Output of the AND circuit 3C is coupled to one input of the OR circuit 3D. Output of the OR circuit 3D is coupled to the SRAM macro 3B. The current control circuit 14 is coupled to the other input of the OR circuit 3D and coupled to one input of the AND circuit 3E in an inverse logic manner so as to be able to output a forced more activation signal FORCE_3 to the OR circuit 3D and the AND circuit 3E. The SRAM I/F 3A and the monitoring circuit 11 are coupled to the other input of the AND circuit 3E so that the SARM I/F 3A is able to output a write enable signal WEN_3 to the AND circuit 3E and the monitoring circuit 11 is able to monitor the write enable signal WEN_3. Output of the AND circuit 3E is coupled to the SRAM macro 3B.

For example, by supplying the SRAM 3 with "0" as the stop signal STP_3 and "1" as the clock enable signal CEN_3, the SRAM 3 will be more activated. On the other hand, by supplying the SRAM 3 with "1" as the stop signal STP_3, the SRAM 3 can be deactivated forcedly. Besides, by supplying the SARM 3 with "1" as the forced more activation signal FORCE_3, the SRAM 3 can be more activated forcedly even when the write enable signal WEN_3 is "0" and the stop signal STP3 is "1". In this case, forcedly more activating the SRAM may be implemented by, for example, idly reading the SRAM when it is more activated forcedly.

The peripheral I/O 4 includes a peripheral circuit control unit 4A, a peripheral circuit 4B, an AND circuit 4C, and an OR circuit 4D. The peripheral circuit control unit 4A and the current control circuit 14 are coupled to one input of the AND circuit 4C in an inverse logic manner so as to be able to output a stop signal STP_4 to the AND circuit 4C. The peripheral circuit control unit 4A and the monitoring circuit 11 are coupled to the other input of the AND circuit 4C so that the peripheral circuit control unit 4A is able to output a clock enable signal CEN_4 to the AND circuit 4C and the monitoring circuit 11 is able to monitor the clock enable signal CEN_4. Output of the AND circuit 4C is coupled to one input of the OR circuit 4D. The current control circuit 14 is coupled to the other input of the OR circuit 4D so as to be able to output a forced more activation signal FORCE_4 to the OR circuit 4D. Output of the OR circuit 4D is coupled to the peripheral circuit 4B.

For example, by supplying the peripheral I/O 4 with "0" as the stop signal STP_4 and "1" as the clock enable signal CEN_4, the peripheral I/O 4 will be more activated. On the other hand, by supplying the peripheral I/O 4 with "1" as the stop signal STP_4, the peripheral I/O 4 can be deactivated forcedly. Besides, by supplying the peripheral I/O 4 with "1" as the forced more activation signal FORCE_4, the peripheral I/O 4 can be more activated forcedly. In this case, for example, what operation the peripheral I/O 4 will perform when it is more activated forcedly may be predefined according to type of the peripheral I/O.

Figure 4:
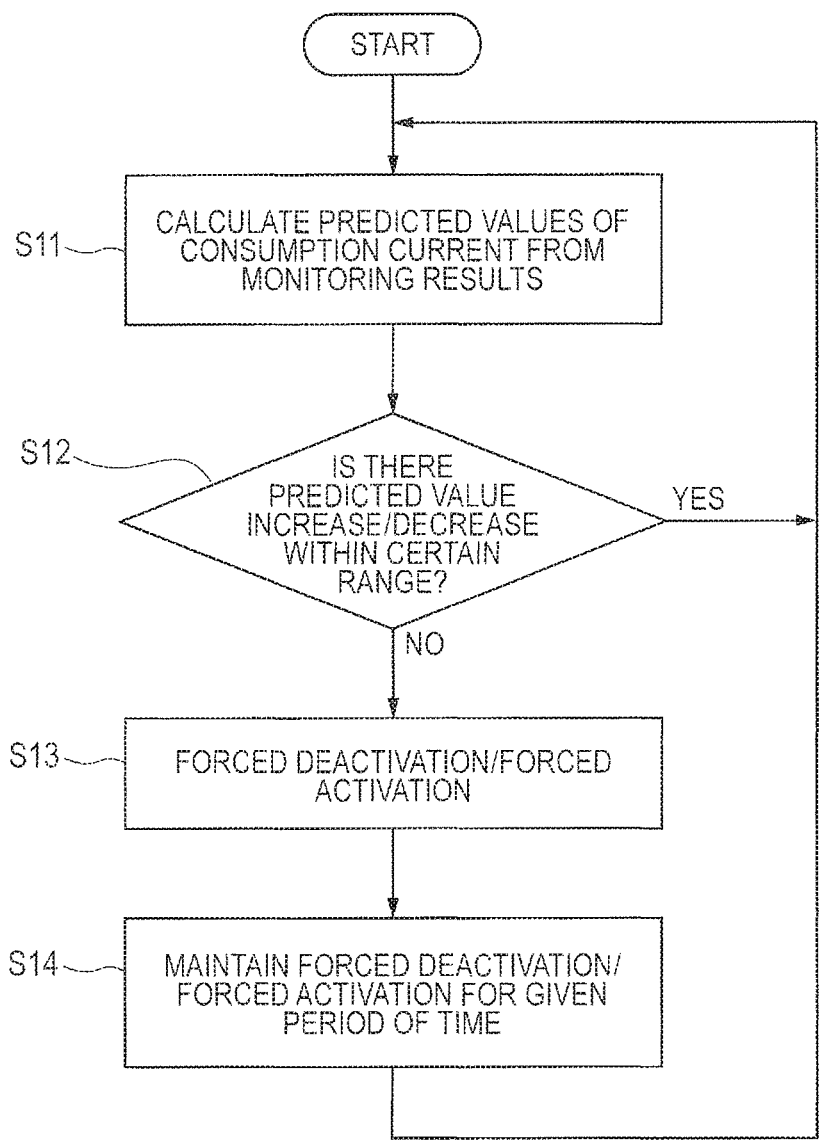
FIG. 4 is a flowchart illustrating a current jump control operation of the semiconductor device concerned with the first embodiment.
Figure 5:
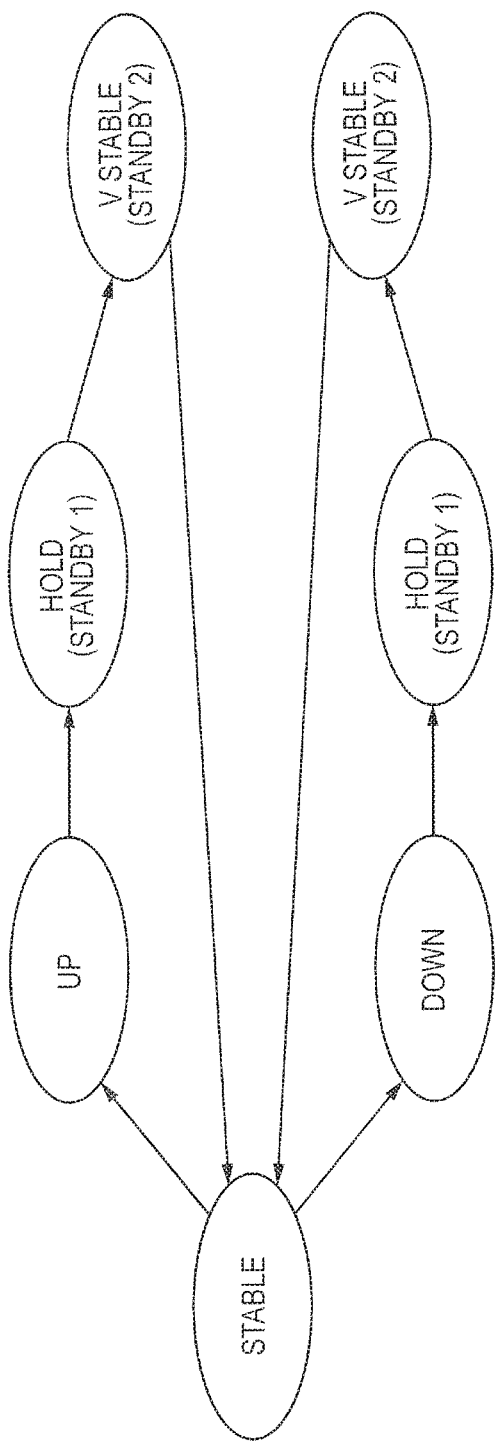
FIG. 5 is a state transition diagram during the current jump control operation of the semiconductor device concerned with the first embodiment.

Then, a description is provided on operation of the current jump control circuit 5. FIG. 4 is a flowchart illustrating a current jump control operation of the semiconductor device 100 concerned with the first embodiment. FIG. 5 is a state transition diagram during the current jump control operation of the semiconductor device 100 concerned with the first embodiment.

Step S11

As noted previously, the monitoring circuit 11 monitors the clock enable signals CEN_1 to CEN_4 for the CPU 1, flash memory 2, SRAM 3, and peripheral I/O 4 and the write enable signal WEN_3 for the SRAM 3 ("STABLE" in FIG. 5).

The decision circuit 12 calculates predicted values of a total amount of consumption electricity in the CPU 1, flash memory 2, SRAM 3, and peripheral I/O 4, based on results of monitoring of the clock enable signals CEN_1 to CEN_4 and the write enable signal WEN_3 at different timings. In particular, the decision circuit calculates a predicted value PVn which is calculated at cycle n (where n is an integer) (which is also referred to as a first predicated value of consumption current) and a predicted value PVm which is calculated at cycle m (where m is an integer equal to or larger than n+1) later than cycle n (which is also referred to as a second predicted value of consumption current).

Calculating a predicted value can be, for example, performed as follows. The decision circuit 12 calculates consumption current, for example, referring to monitoring results at the rising edge of a clock signal CLK. For example, in a write state of the SRAM 3, i.e., when the signals are such that STP_3=0, CEN_3=1, and WEN_3=1, a predicted value of current consumption of the SRAM 3 is estimated to be 1.5 mA/cycle. Besides, in a read state of the SRAM 3, i.e., when the signals are such that STP_3=0, CEN_3=1, and WEN_3=0, a predicted value of current consumption of the SRAM 3 is estimated to be 1.0 mA/cycle.

Besides, for example, in a read state of the flash memory 2, i.e., when the signals are such that STP_2=0 and CEN_2=1, a predicted value of current consumption of the flash memory 2 is estimated to be 4.0 mA/cycle. Furthermore, for example, in a calculation execution state of the CPU 1, i.e., when the signals are such that STP_1=0 and CEN_1=1, a predicted value of current consumption of the CPU 1 is estimated to be 0.5 mA/cycle.

Predicted values of current consumption in the respective blocks whose operations are controlled by the clock enable signals CEN_1 to CEN 4 and the write enable signal WEN_3 for the SRAM 3 are stored into the storage unit 13 as parameters. According to results of monitoring of the clock enable signals CEN_1 to CEN 4 and the write enable signal WEN_3 for the SRAM 3, by referring to the parameters in the storage unit 13, the decision circuit 12 can read out predicted values of consumption current in the respective blocks and add these values.

Here, the parameters representing the predicted values of current consumption in the respective blocks can be calculated by a current simulation; these parameters may be static or may be parameters that can be rewritten externally.

Step S12

The decision circuit 12 detects a current jump, based on the predicted values of the total amount of consumption current calculated per clock cycle. In particular, relative to the predicted value PVn calculated at cycle n, the decision circuit detects if the predicted value PVm calculated at cycle m has increased by more than a given value (a threshold JUMP_UP_MAX which is also referred to as a first value) or has decreased by more than a given value (a threshold JUMP_DWN_MAX which is also referred to as a second value). That is, the decision circuit detects if PVm−PVn>JUMP_UP_MAX or if PVn−PVm>JUMP_DWN_MAX. The decision circuit 12 outputs a detection signal DET indicating that a current jump has occurred.

Here, the threshold JUMP_UP_MAX and the threshold JUMP_DWN_MAX are stored into, e.g., the storage unit 13 as parameters for use for decision. The threshold JUMP_UP_MAX and the threshold JUMP_DWN_MAX which are stored in the storage unit 13 may be static or may be parameters that can be rewritten externally.

The threshold JUMP_UP_MAX and the threshold JUMP_DWN_MAX may be predefined values.

The decision circuit 12 may average predicted values of consumption current over a plurality of clock cycles and compare the resultant average predicted value with an average predicted value over another period. For example, the decision circuit may calculate a first average predicted value over successive five clock cycles, then, calculate a second average predicted value over subsequent successive five clock cycles, and compare the first and second average predicted values to detect a current jump.

Furthermore, the decision circuit 12 may calculate a predicted value of consumption current depending on the frequency of the clock signal CLK. In this case, given that a predicted value E1 with the clock signal frequency being f1 is converted to a predicted value W2 with the clock signal frequency being f1 being f2, W1 may be divided by a frequency division ratio (f1/f2) (W2=W1/(f1/f2).

Step S13

When the current control circuit 14 has been notified of current jump occurrence by the detection signal DET, it outputs the stop signal or forced more activation signal to a subset or all of the CPU 1, flash memory 2, SRAM 3, and peripheral I/O 4.

In fact, if a steep increase in current has been detected, the current control circuit 14 outputs a subset or all of stop signals STP_1 to STP_4 and performs control to make the predicted value of consumption current smaller than the given value. This corresponds to a state transition from "STABLE" to "DOWN" in FIG. 5.

If a steep decrease in current has been detected, the current control circuit 14 outputs a subset or all of forced more activation signals FORCE_1 to FORCE_4 and performs control to make the predicted value of consumption current larger than the given value. This corresponds to a state transition from "STABLE" to "UP" in FIG. 5. A possible way of increasing the consumption current is, for example, a dummy read operation of the flash memory 2 and SRAM 3, that is, reading is performed, but values that have been read are not used. Additionally, increasing the current is also possible in such a way that a dummy circuit which is not used in normal operation is provided in each block and the dummy circuit is activated.

A block or blocks that should be deactivated or more activated forcedly among the CPU 1, flash memory 2, SRAM 3, and peripheral I/O 4 may be selected by priority order or predetermined. Priority order of blocks that should be deactivated or more activated forcedly may be stored into, e.g., the storage unit 13 and the current control circuit 14 may read out it from the storage unit 13.

For instance, when the CPU 1 is executing a process that cannot be halted, forced deactivation of the CPU 1 should be avoided and other blocks, such as the SRAM, which will not suffer from an error or the like even when deactivated forcedly, may be deactivated forcedly. Also, the flash memory 2 and the SRAM 3 may be deactivated forcedly on a preferential basis. In this case, a response to access from the CPU 1 of the flash memory 2 and the SRAM 3 is delayed, but the CPU 1 can read out desired data after recovery to the active state of the flash memory 2 and the SRAM 3.

Step S14

Then, the forced deactivation or forced more activation state is maintained only for a given period of time to restrain the influence of a voltage fluctuation due to the current jump. A given period of time for which the forced deactivation or forced more activation state should be maintained is calculated by circuit simulation or the like and stored in advance into the storage unit 13 as a parameter, so that the current control circuit 14 can read out it. Carrying out forced deactivation or forced more activation and maintaining it for a given period of time correspond to "HOLD" (Standby 1) in FIG. 5.

Then, an internal voltage V of the semiconductor device 100, i.e., its power supply voltage is monitored. Monitoring the internal voltage V can be, for example, performed by the current control circuit 14. In particular, the current control circuit monitors if the internal voltage V remains stable within a given range for a predetermined period. Monitoring the internal voltage can be, for example, performed by the current control circuit 14. A predetermined period for which the internal voltage should be monitored is stored in advance into the storage unit 13 as a parameter, so that the current control circuit 14 can read out it. And now, if the internal voltage V is stable, the forced deactivation or forced more activation state is cancelled and a recovery is made to signal monitoring by the monitoring circuit 11, followed by monitoring whether or not a current jump occurs. Monitoring the internal voltage and maintaining and cancelling the more activation state correspond to "V STABLE" (Standby 2) in FIG. 5.

As described hereinbefore, according to the semiconductor device 100, consumption current is controlled by detecting a current jump occurrence and carrying out forced deactivation or forced more activation of a block or blocks; in consequence, a fluctuation of internal voltage can be restrained.

Figure 6:
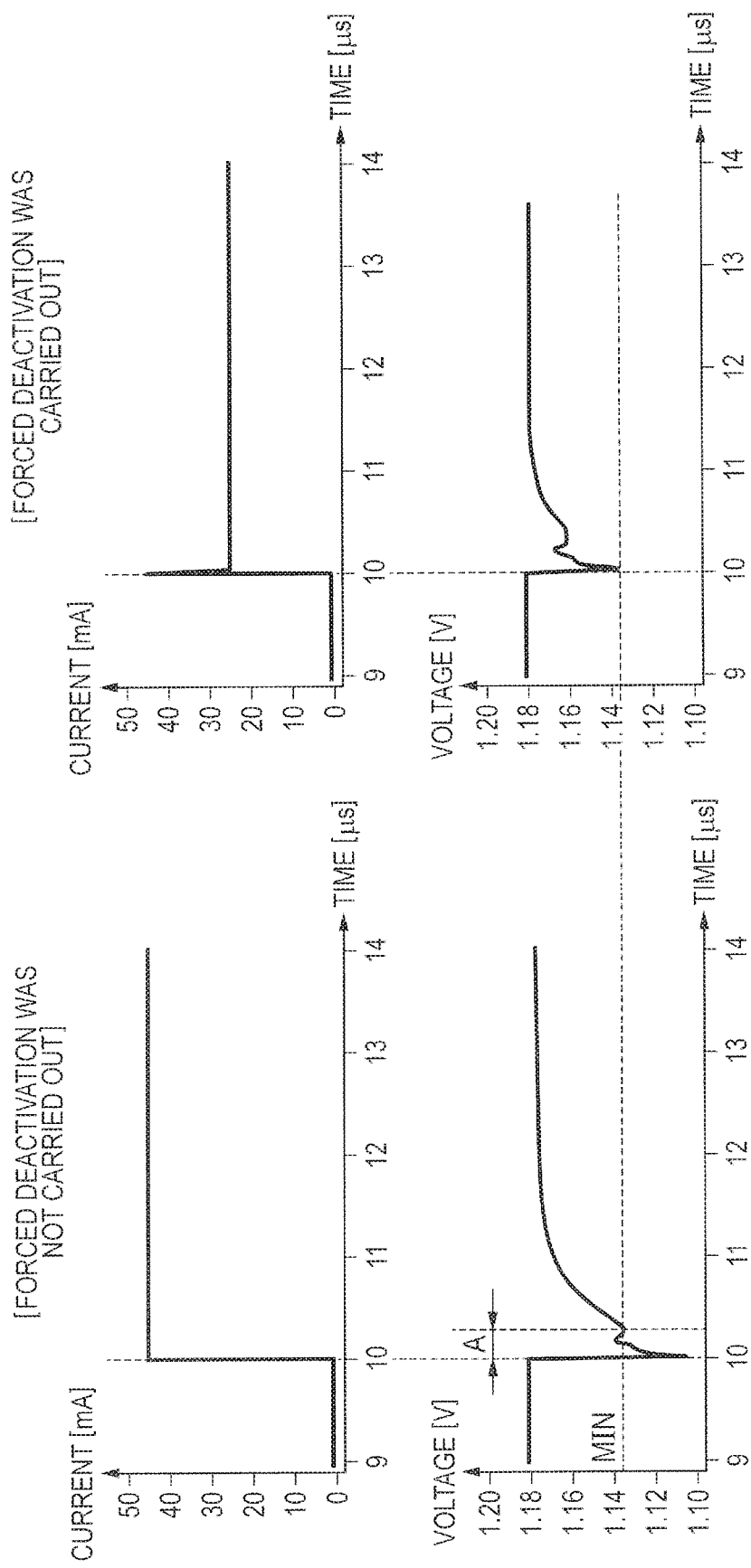
FIG. 6 is a diagram giving a graphic representation of forced deactivation when a current jump has occurred.

Then, we verify restraining a current jump in the semiconductor device 100. FIG. 6 gives a graphic representation of forced deactivation when a current jump has occurred. In FIG. 6, the left part plots a graph for a case where forced deactivation was not carried out upon the occurrence of a current jump, as a comparison example, and the right part plots a graph for a case forced deactivation was carried out upon the occurrence of a current jump according to the present embodiment. As presented in FIG. 6, in the comparison example at the left, an abrupt sharp rise of current occurs at time 10 μsec, resulting in that the internal voltage becomes lower than a lower limit value MIN of a guaranteed voltage. In this case, consequently, malfunction could occur in the semiconductor device.

In contrast, according to the semiconductor device 100, as presented at the right in FIG. 6, when an abrupt sharp rise of current has occurred at time 10 μsec, the current jump control circuit 5 detects a current jump occurrence and forcedly deactivates a block or blocks allowed to be deactivated. It can be understood that this makes a voltage drop less than in the comparison example and the internal voltage falls in a range higher than the lower limit value MIN of the guaranteed voltage.

As described hereinbefore, according to the present configuration, by monitoring signals internal to the respective blocks of the semiconductor device and predicting consumption current, it is possible to forcedly deactivate or more activate the blocks in order to reduce the influence of an abrupt sharp fluctuation of current which might occur. In consequence, it is possible to prevent the internal voltage from deviating from a guaranteed voltage range due to a current jump.

Second Embodiment

A semiconductor device 200 concerned with a second embodiment is described. FIG. 7 schematically depicts a configuration of a principal part of the semiconductor device 200 concerned with the second embodiment. The semiconductor device 200 is configured such that parameters for use for control of a current jump stored in a register in a storage unit 13 can be updated automatically by control of an external control circuit 1000.

The semiconductor device 200 has a configuration in which a ROM (Read Only Memory) 8 is added to the semiconductor device 100. The ROM 8 is able to send and receive data to/from other blocks, such as the CPU 1, within the semiconductor device 200 via a bus 7 (not depicted). The semiconductor device 200 is able to send and receive signals and data to/from the external control circuit 1000 and a watchdog timer (WDT) 1001 via an external bus 1002.

A description is provided about a method for automatically updating parameters for use for control of a current jump. FIG. 8 is a flowchart illustrating the method for automatically updating parameters for use for control of a current jump in the semiconductor device 200 concerned with the second embodiment.

Step S21

The external control circuit 1000 directs semiconductor device 200 to automatically update parameters for use for control of a current jump by giving a control signal to the semiconductor device 200 via the external bus 1002. Thereby, the CPU 1 initializes the parameters stored in the ROM 8. Also, the external control circuit 1000 starts up the WDT 1001.

Step S22

The CPU 1 updates the parameters stored in the ROM 8 by executing, e.g., a given program. A given program which is used by the CPU 1 is stored in advance into, e.g., the ROM 8 and the CPU 1 may read out it as required.

Step S23

The CPU 1 reads out updated parameters and writes them into a register in the storage unit 13 of the current jump control circuit 13 as the parameters for use for control of a current jump.

Step S24

The CPU 1 executes a test program to test a current jump control operation. This test program causes the semiconductor device 200 to execute a process in which a current jump will occur or a current jump is likely to occur.

Step S25

Upon the occurrence of a current jump and when the current jump control operation is performed by the current jump control circuit 5, the CPU 1 monitors if the internal voltage of the semiconductor device 200 falls within a desired range. And now, in the present embodiment, if the internal voltage of the semiconductor device 200 falls within the desired range, a stop signal is output from the semiconductor device 200 to the WDT 1001.

Step S26

If the internal voltage of the semiconductor device 200 deviates from the desired range, the WDT 1001 outputs a reset signal RES to the semiconductor device 200 after elapse of a given period from its startup. Thereby, the CPU 1 returns to step S22, updates the parameters in the ROM 8 again, and performs processing at step S23 and subsequent.

Step S27

If the internal voltage of the semiconductor device 200 falls within the desired range, the stop signal is output from the semiconductor device 200 to the WDT 1001. In consequence, the WDT1 stops and the operation of updating the parameters terminates.

As will be appreciated from the foregoing, it can be understood that parameters for use for control of a current jump can be set to prevent the internal voltage of the semiconductor device from deviating from a given range due to a current jump caused to occur by the test program.

Automatically updating parameters for use for control of a current jump according to the present embodiment can be performed, for example, by giving a directive to the semiconductor device 200 when it is inspected for shipment, when it is booted, or after it is mounted in equipment or the like. Thereby, it is possible to correct variation attributed to semiconductor device manufacturing errors and depending on semiconductor device usage environment and restrain an internal voltage fluctuation due to a current jump more reliably.

Other Embodiments

While the invention made by the present inventors has been described specifically based on its embodiments hereinbefore, it will be appreciated that the present invention is not limited to the embodiments described previously and various modifications may be made thereto without departing from the gist of the invention. For instance, in the foregoing embodiments, the CPU 1, flash memory 2, SRAM 3, and peripheral I/O 4 are used as blocks which are deactivated or more activated forcedly. This is only for illustrative purposes. Blocks of various processors, controllers, etc. other than these blocks may be deactivated or more activated forcedly.

Besides, a special-purpose block that has a small area and consumes more current may be provided in advance in the semiconductor device and the amount of consumption electricity may be augmented by more activating this block forcedly.

For example, by making an arrangement to forcedly deactivate or more activate a block consuming more power on a preferential basis, restraining a current jump can be implemented by more simple control. Thereby, it becomes unnecessary to monitor blocks having a less consumption current fluctuation and the size of the current jump control circuit 5 can be reduced.

Instead of forced deactivation, the operating frequency of a block which is put into operation may be decreased forcedly. This enables it to reduce the consumption current of the block. Instead of forced more activation, the operating frequency of a block which is put into operation may be increased forcedly. This enables it to augment the consumption current of the block.

In the foregoing embodiments, a standby time that is relevant to step S14 in FIG. 4 may differ for each block.

What is claimed is:

1. A semiconductor device comprising:
a plurality of blocks, each of which performs a given operation; and
a control circuit which monitors control signals in each of the blocks and calculates a predicted value of consumption current of the blocks, based on results of monitoring at different timings, thereby controlling a fluctuation of consumption current of the blocks,
wherein if an increase of a predicted value of consumption current of the blocks is larger than a first value, the control circuit controls a subset or all of the blocks to decrease consumption current, and
wherein if a decrease of the predicted value of consumption current of the blocks is larger than a second value, the control circuit controls a subset or all of the blocks to increase consumption current.

2. The semiconductor device according to claim 1, wherein the control circuit calculates a first predicted value of consumption current of the blocks, wherein the control circuit calculates a second predicted value of consumption current of the blocks after calculating the first predicted value of consumption current of the blocks, wherein if a value obtained by subtracting the first predicted value of consumption current of the blocks from the second predicted value of consumption current of the blocks is larger than the first value, the control circuit deactivates a subset or all of the blocks or decreases a operating frequency of a subset or all of the blocks, and wherein if a value obtained by subtracting the second predicted value of consumption current of the blocks from the first predicted value of consumption current of the blocks is larger than the second value, the control circuit activates a subset or all of the blocks to perform a given operation or increases a operating frequency of a subset or all of the blocks.

3. The semiconductor device according to claim 2, wherein each of the first and second predicted values of consumption current of the blocks is a predicted value of consumption current of the blocks for a period including one or more clock cycles.

4. The semiconductor device according to claim 3, wherein one of the blocks is a memory block, and
wherein one of the control signals is an enable signal for the memory block.

5. The semiconductor device according to claim 4, wherein the given operation is a dummy read of the memory block.

6. The semiconductor device according to claim 3, wherein at least one of the blocks comprises a dummy circuit which operates when the given operation is performed.

7. The semiconductor device according to claim 1, wherein the control circuit maintains an operating state of the subset or all of the blocks for a given period of time, after forcedly controlling operation of the subset or all of the blocks.

8. The semiconductor device according to claim 7, wherein the control circuit monitors a power supply voltage, after maintaining the operating state of the subset or all of the blocks for the given period of time, and cancels the forced control exerted on operation of the subset or all of the blocks, if the power supply voltage remains within a given range for the given period of time.

9. The semiconductor device according to claim 1, wherein the control circuit comprises a storage unit in which parameters are stored for use in calculating the predicted values of consumption current of the blocks from the results of monitoring.

10. The semiconductor device according to claim 9, wherein parameters for the control circuit to control operation of the subset or all of the blocks are stored in the storage unit.

11. The semiconductor device according to claim 10,
wherein the parameters stored in the storage unit can be updated,
wherein a control is exerted on operation of the subset or all of the blocks, if it has been detected that a predicted value of consumption current of the blocks calculated using the parameters set in the storage unit deviates from a given current range, and
wherein the control circuit monitors a power supply voltage, retains used parameters as the parameters in the storage unit, if a fluctuation of the monitored power supply voltage falls within a given voltage range, and changes parameter values set in the storage unit, if the fluctuation of the power supply voltage is out of the given voltage range.

* * * * *